United States Patent [19]

Ushida et al.

[11] Patent Number: 5,500,142
[45] Date of Patent: Mar. 19, 1996

[54] PIEZOELECTRIC CERAMICS

[75] Inventors: Yoshihisa Ushida; Hiroshi Mase, both of Sodegaura, Japan

[73] Assignee: Mitsui Petrochemical Industries, Ltd., Tokyo, Japan

[21] Appl. No.: 334,123

[22] Filed: Nov. 4, 1994

[30] Foreign Application Priority Data

Nov. 4, 1993 [DE] Germany .................. 5-275528

[51] Int. Cl.⁶ .................................. C04B 35/48
[52] U.S. Cl. .................. 252/62.9 R; 252/62.9 PZ; 501/134; 501/135; 501/136
[58] Field of Search .................. 252/62.9, 62.9 PZT; 501/134, 135, 136, 138; C04B 35/49

[56] References Cited

U.S. PATENT DOCUMENTS 5,079,197  1/1992  Ushida et al. .................. 252/62.9

FOREIGN PATENT DOCUMENTS

| | | |
|---|---|---|
| 2004268 | 3/1979 | European Pat. Off. . |
| 0344978 | 12/1989 | European Pat. Off. . |
| 0423822 | 4/1991 | European Pat. Off. . |
| 2952649 | 7/1980 | Germany .................. 252/62.9 |
| 48-8434 | 3/1973 | Japan . |
| 50-48499 | 4/1975 | Japan .................. 252/62.9 |
| 55-91891 | 7/1980 | Japan .................. 252/62.9 |
| 60-103079 | 6/1985 | Japan .................. 252/62.9 |
| 62-089372 | 4/1987 | Japan .................. C04B 35/49 |
| 5-58729 | 3/1993 | Japan . |
| 743976 | 6/1980 | U.S.S.R. .................. 252/62.9 |

*Primary Examiner*—Anthony Green
*Attorney, Agent, or Firm*—Birch, Stewart, Kolasch & Birch

[57] ABSTRACT

A piezoelectric ceramic is provided which comprises a perovskite-based solid solution represented by the formula:

$$Pb_{1-a}M_a\{(Ni_{1-b}Zn_b)_{1/3}Nb_{2/3}\}_xTi_yZr_zO_3$$

wherein M represents Ba or Sr and $x+y+z=1$,
the perovskite-based solid solution having, added thereto, $La_2O_3$ or $Nd_2O_3$, as a metallic oxide of Group A and NiO, $Fe_2O_3$, $SnO_2$ or $Ta_2O_5$ as a metallic oxide of Group B. The piezoelectric ceramic of the present invention exhibits large value of piezoelectric constant d and high Curie point, so that it is useful as a material of a piezoelectric actuator.

6 Claims, No Drawings

PIEZOELECTRIC CERAMICS

FIELD OF THE INVENTION

The present invention relates to a perovskite-based piezoelectric ceramic containing Pb. More particularly, the present invention is concerned with a piezoelectric ceramic whose piezoelectric constant d and Curie point values are both large, so that it is useful especially as a material in a piezoelectric actuator.

BACKGROUND OF THE INVENTION

The piezoelectric actuator which utilizes the reverse piezoelectric effect of a piezoelectric ceramic finds various uses in, for example, precision position setting, a printer and a camera shutter. The piezoelectric ceramic for use in the piezoelectric actuator is specifically required to have large value of the piezoelectric constant d, so that the displacement per voltage is large, and also to exhibit a high Curie point, so that the piezoelectric actuator can be used in a wide range of temperature.

A piezoelectric ceramic represented by the formula:

$$Pb[(Ni_{1-b}Zn_b)_{1/3}Nb_{2/3}]O_3\text{-}PbTiO_3\text{-}PbZrO_3$$

is known as an example of the piezoelectric ceramic having relatively large value of the piezoelectric constant d and a relatively high Curie point. The above piezoelectric ceramic is described in, for example, Japanese Patent Publication No. 48(1973)-8434 and Japanese Patent Laid-open Publication No. 5(1993)-58729.

With respect to the above piezoelectric ceramic represented by the formula:

$$Pb[(Ni_{1-b}Zn_b)_{1/3}Nb_{2/3}]O_3\text{-}PbTiO_3\text{-}PbZrO_3,$$

the less the content of $Pb[(Ni_{1-b}Zn_b)_{1/3}Nb_{2/3}]O_3$ or the greater the value of b, the higher the Curie point but the smaller the value of the piezoelectric constant d.

When the piezoelectric actuator is used in, for example, a high-speed drive element employed in a printer or the like, a high frequency and a high voltage are applied, so that the temperature of the element is raised. When the temperature of the element rises to about the Curie point, the displacement is rapidly reduced. Further, when the temperature of the element exceeds the Curie point, the polarization is released, thereby no longer exhibiting any significant displacement.

Therefore, a piezoelectric actuator capable of stably exhibiting a large displacement, even when the temperature of the element is high, has been demanded in the art. Thus, the development of a piezoelectric ceramic having not only large value of piezoelectric constant d, but also a high Curie point, as a starting material of the piezoelectric actuator has been desired in the art.

The inventors have extensively and intensively studied the effects of the variety and proportion of added oxide on the composition of the piezoelectric ceramic based on $Pb[(Ni_{1-b}Zn_b)_{1/3}Nb_{2/3}]O_3\text{-}PbTiO_3\text{-}PbZrO_3$ in which the content of $Pb[(Ni_{1-b}Zn_b)_{1/3}Nb_{2/3}]O_3$ is relatively small and the value of b is large. As a result, the inventors have found a piezoelectric ceramic which exhibits large value of the piezoelectric constant d and a high Curie point, so that it is useful as a material of a piezoelectric actuator.

OBJECT OF THE INVENTION

The present invention has been completed in the above situation. Thus, the object of the present invention is to provide a piezoelectric ceramic which exhibits large value of piezoelectric constant d and high Curie point, so that it is useful as a material of a piezoelectric actuator.

SUMMARY OF THE INVENTION

The piezoelectric ceramic of the present invention comprises a perovskite-based solid solution represented by the formula:

$$Pb_{1-a}M_a\{(Ni_{1-b}Zn_b)_{1/3}Nb_{2/3}\}_xTi_yZr_zO_3$$

wherein M represents Ba or Sr, x+y+z=1,
a=0.01 to 0.10,
b=0.50 to 0.90,
x=0.15 to 0.25
y=0.35 to 0.45
z=0.35 to 0.45,
said perovskite-based solid solution containing at least one oxide selected from among the following Group A in combination with at least one oxide selected from among the following Group B:

Group A: $La_2O_3$ and $Nd_2O_3$, and
Group B: NiO, $Fe_2O_3$, $SnO_2$ and $Ta_2O_5$.

In this piezoelectric ceramic, it is preferred that the metallic ion of the above at least one oxide selected from Group A be contained in an amount of 0.5 to 2.0 in equivalent, and that the metallic ion of the above at least one oxide selected from among the Group B be contained in an amount satisfying the relationship $1.0 \leq N \leq 4.0$
in which $$N = \sum_{j=1}^{j} n_{Bj}\chi_{Bj} / \sum_{i=1}^{i} n_{Ai}\chi_{Ai}$$

wherein $n_{Ai}$ represents the valence of the metallic ion of the at least one oxide selected from Group A, $n_{Bj}$ represents the valence of the metallic ion of the at least one oxide selected from Group B, $\chi_{Ai}$ represents the equivalent of the metallic ion of the at least one oxide selected from Group A, and $\chi_{Bj}$ represents the equivalent of the metallic ion of the at least one oxide selected from Group B, when the total equivalents of Pb and M of the perovskite-based solid solution represented by the formula:

$$Pb_{1-a}M_a\{(Ni_{1-b}Zn_b)_{1/3}Nb_{2/3}\}_xTi_yZr_zO_3$$

[wherein M is Ba or Sr, and x+y+z=1]
is 100.

DETAILED DESCRIPTION OF THE INVENTION

The piezoelectric ceramic of the present invention will be described in greater detail below.

The piezoelectric ceramic of the present invention comprises a perovskite-based solid solution represented by the formula:

$$Pb_{1-a}M_a\{(Ni_{1-b}Zn_b)_{1/3}Nb_{2/3}\}_xTi_yZr_zO_3$$

wherein M represents Ba or Sr, x+y+z=1,
a=0.01 to 0.10, preferably 0.02 to 0.07,
b=0.50 to 0.90,
x=0.15 to 0.25, preferably 0.17 to 0.23,
y=0.35 to 0.45, preferably 0.37 to 0.43, z=0.35 to 0.45, perferably 0.37 to 0.43.

In the present invention, the perovskite-based solid solution contains at least one oxide selected from Group A consisting of $La_2O_3$ and $Nd_2O_3$, in combination with (or together with) at least one oxide selected from Group B consisting of NiO, $Fe_2O_3$, $SnO_2$ and $Ta_2O_3$.

When the above formula:

$$Pb_{1-a}M_a\{(Ni_{1-b}Zn_b)_{1/3}Nb_{2/3}\}_xTi_yZr_zO_3$$

[wherein M is Ba or Sr, and x+y+z=1] is represented by the general formula of the perovskite-based solid solution, $ABO_3$, the site A is filled with Pb, Ba or Sr in the form of a metallic ion, and the site B is filled with Ti, Zr, Nb, Zn or Ni in the form of a metallic ion.

Furthermore, when the piezoelectric ceramic of the present invention is represented by the general formula $ABO_3$, at least one oxide selected from the above Group A is placed in part of the site A in the form of a metallic ion represented by the formula:

$$La^{3+} \text{ or } Nd^{3+} \quad [Ai].$$

On the other hand, at least one oxide selected from the above Group B is placed in part of the site B in the form of a metallic ion represented by the formula:

$$Ni^{2+}, Fe^{3+}, Sn^{4+} \text{ or } Ta^{5+} \quad [Bi].$$

It is preferred that the above metallic ion of the at least one oxide selected from Group A be contained in an amount of 0.5 to 2.0 equivalents, when the total equivalents of Pb and M of the perovskite-based solid solution represented by the formula:

$$Pb_{1-a}M_a\{(Ni_{1-b}Zn_b)_{1/3}Nb_{2/3}\}_xTi_yZr_zO_3$$

[wherein M is Ba or Sr, and x+y+z=1] is 100.

Further, it is preferred that the metallic ion of the above at least one oxide selected from Group B be contained in an amount satisfying the relationship $1.0 \leq N \leq 4.0$, preferably $1.5 \leq N \leq 3.0$ in which $$N = \sum_{j=1}^{j} n_{Bj}\chi_{Bj} / \sum_{i=1}^{i} n_{Ai}\chi_{Ai}$$

wherein $n_{Ai}$ represents the valence of the metallic ion of the at least one oxide selected from Group A, $n_{Bj}$ represents the valence of the metallic ion of the at least one oxide selected from Group B, $\chi_{Ai}$ represents the equivalent of the metallic ion of the at least one oxide selected from Group A, and $\chi_{Bj}$ represents the equivalent of the metallic ion of the at least one oxide selected from Group B, when the total equivalents of Pb and M of the above perovskite-based solid solution is 100.

The piezoelectric ceramic of the present invention containing the above at least one oxide selected from the Group A in combination with the above at least one oxide selected from Group B has a desirably large value of the piezoelectric constant d and a desirably high Curie point, by virtue of the presence of the metallic ions of the Groups A and B in the above specified ranges relative to the equivalents of Pb and M of the solid solution.

The piezoelectric ceramic of the present invention may be produced by sintering powdery metal compounds, such as powdery metal oxides and metal salts, which provide the required metal oxide components upon being sintered. The above powdery metal compounds may be produced by processes which are not particularly limited, for example, by the various conventional processes including the liquid phase and solid phase processes. Examples of the applicable liquid phase processes include the precipitation, coprecipitation, alkoxide and sol-gel processes. Examples of the applicable solid phase processes include the oxalate decomposition and oxide mixing processes.

For example, the powdery metal compounds obtained in any of the above processes are blended in given proportions and calcined at 800° to 1000° C., and the resultant calcined material is pulverized by means of a ball mill or the like. The obtained powder is molded by pressing at 500 to 1500 kg/cm² and sintered at 1000° to 1300° C., thereby obtaining the piezoelectric ceramic of the present invention.

EFFECT OF THE INVENTION

The piezoelectric ceramic of the present invention has desirably large value of the piezoelectric constant d and a desirably high Curie point, by virtue of the presence in the above specified ranges of the metal oxides of the Groups A and B in the perovskite-based solid solution having the composition within the specified range.

The displacement per voltage of this piezoelectric ceramic is large, and the range of temperatures at which the piezoelectric ceramic can work is so large that large displacement is exhibited even at high temperatures. Therefore, this piezoelectric ceramic exhibits excellent characteristics when it is used in a piezoelectric actuator, etc.

EXAMPLES

The present invention will be further illustrated with reference to the following Examples, which should not be construed as limiting the scope of the invention.

The measurements of the dielectric constant ($\epsilon_r$), electric machine coupling coefficient ($k_p$) and piezoelectric constant ($d_{31}$) were performed in accordance with the methods prescribed in standard of Electronic Materials Manufacturers Association of Japan (EMAS).

Examples 1 to 4 and Comparative Examples 1 to 3

PbO (or $Pb_3O_4$), $ZrO_2$, $TiO_2$, NiO, ZnO, $Nb_2O_5$, $SrCO_3$, $La_2O_3$ and $SnO_2$ were weighed out into a ball mill in proportions providing the compositions specified in Table 1, and pulverized and mixed in the ball mill. Each of the resultant powdery mixtures was calcined at 1000° C. for 1 hr, and the calcined material was pulverized by means of a ball mill, and then was graded. The obtained powder was molded into a disk having a diameter of 25 mm by pressing at 1000 kg/cm², and sintered at 1100° C. for 2 hr.

The resultant sintered object was polished until it had a thickness of 0.5 mm, and silver electrodes were applied to both major surfaces of the object and baked. The baked object was polarized by immersing the same in a silicone oil heated at 100° C. and applying 20 kV/cm direct current, and aged for 12 hr, and the electrical properties thereof were measured.

The results are shown in Table 1.

In the table, each of a, b, x, y and z represents a coefficient of the formula $$Pb_{1-a}M_a\{(Ni_{1-b}Zn_b)_{1/3}Nb_{2/3}\}_xTi_yZr_zO_3$$

[wherein x+y+z=1].

Further, in the table, the amount of the ion of Group A indicates the amount of added oxide $La_2O_3$ in terms of equivalents of the metallic ion thereof per 100 in equivalents of the total of Pb and Sr. The amount of the ion of the Group B indicates amount in each of the added oxides NiO and $SnO_2$ in terms of equivalents of the metallic ion thereof per 100 equivalents of the total of Pb and Sr.

Still further, in the table, N is the value defined by the formula:

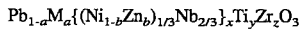

wherein $n_{Ai}$ represents the valence of the metallic ion of the at least one oxide selected from Group A, $nB_j$ represents the valence of the metallic ion of the at least one oxide selected from Group B, $\chi_{Ai}$ represents the atomic equivalent of the metallic ion of the at least one oxide selected from Group A, and $\chi_{Bj}$ represents the atomic equivalent of the metallic ion of the at least one oxide selected from Group B.

It is recognized by comparing the results of Examples 1 to 3 with those of Comparative Examples 1 and 2 that the additions of $La^{3+}$ as a metallic ion of Group A and $Ni^{2+}$ and $Sn^{4+}$ as metallic ions of Group B (Examples 1 to 3) increase the dielectric constant $\epsilon_r$ and electric machine coupling coefficient $k_p$, so that the piezoelectric constant $d_{31}$ is markedly increased, while causing the lowering of the Curie point Tc to be relatively small to maintain the same at a high temperature, as compared with those of only the perovskite-based solid solution represented by the formula $$Pb_{1-a}M_a\{(Ni_{1-b}Zn_b)_{1/3}Nb_{2/3}\}_xTi_yZr_zO_3$$

[wherein x+y+z= 1] (Comparative Example 1) and the addition of only $Ni^{2+}$ (Comparative Example 2).

Also, as is recognized by comparing the results of Example 4 with those of Comparative Example 3, the additions of $La^{3+}$, $Ni^{2+}$ and $Sn^{4+}$ to the perovskite-based solid solution increase the dielectric constant $\epsilon_r$ and electric machine coupling coefficient $k_p$, so that the piezoelectric constant d31 is markedly increased, while causing the lowering of the Curie point Tc to be relatively small to maintain the same at a high temperature.

Examples 5 to 7

Samples were prepared and their electrical properties were measured in the same manner as in Example 1, except that the types and amounts of oxides of Groups A and B added to the perovskite-based solid solution represented by the formula $$Pb_{1-a}M_a\{(Ni_{1-b}Zn_b)_{1/3}Nb_{2/3}\}_xTi_yZr_zO_3$$

[wherein x+ y+z=1] were varied.

The results are shown in Table 1.

In these examples, piezoelectric ceramics were obtained, each of which had high Curie point Tc, dielectric constant $\epsilon_r$ and electric machine coupling coefficient $k_p$, thus having high piezoelectric constant $d_{31}$, as well as in Examples 1 to 4.

TABLE 1

| | | | Composition | | | | |
|---|---|---|---|---|---|---|---|
| | a | b | x | y | z | Ion of Group A | Ion of Group B | N |
| Ex. 1 | 0.05 | 0.8 | 0.2 | 0.39 | 0.41 | $La^{3+}$ 1.0 | $N^{2+}$ 1.0 $Sn^{4+}$ 1.0 | 2.0 |
| Ex. 2 | 0.05 | 0.8 | 0.2 | 0.39 | 0.41 | $La^{3+}$ 1.0 | $Ni^{2+}$ 0.5 $Sn^{4+}$ 1.0 | 1.67 |
| Ex. 3 | 0.05 | 0.8 | 0.2 | 0.39 | 0.41 | $La^{3+}$ 1.0 | $Ni^{2+}$ 2.0 $Sn^{4+}$ 1.0 | 2.67 |
| Comp. Ex. 1 | 0.05 | 0.8 | 0.2 | 0.39 | 0.41 | — | — | — |
| Comp. Ex. 2 | 0.05 | 0.8 | 0.2 | 0.39 | 0.41 | — | $N^{2+}$ 1.0 | — |
| Ex. 4 | 0.05 | 0.6 | 0.2 | 0.4 | 0.4 | $La^{3+}$ 1.0 | $N^{2+}$ 1.0 $Sn^{4+}$ 1.0 | 2.0 |
| Comp. Ex. 3 | 0.05 | 0.6 | 0.2 | 0.4 | 0.4 | — | — | — |
| Ex. 5 | 0.05 | 0.8 | 0.2 | 0.39 | 0.41 | $Nd^{3+}$ 1.0 | $N^{2+}$ 1.0 $Sn^{4+}$ 1.0 | 2.0 |
| Ex. 6 | 0.05 | 0.8 | 0.2 | 0.39 | 0.41 | $La^{3+}$ 1.0 | $Ni^{2+}$ 0.86 $Ta^{5+}$ 0.86 | 2.0 |
| Ex. 7 | 0.05 | 0.8 | 0.2 | 0.39 | 0.41 | $La^{3+}$ 1.0 | $Fe^{3+}$ 0.67 $Sn^{4+}$ 1.0 | 2.0 |

| | Electrical characteristics | | | |
|---|---|---|---|---|
| | $\epsilon_r$ | $k_p$ % | $d_{31}$ $\times 10^{-12}$ m/V | Tc °C. |
| Ex. 1 | 3910 | 71.1 | 309 | 225 |
| Ex. 2 | 3360 | 71.7 | 290 | 226 |
| Ex. 3 | 3720 | 68.5 | 292 | 220 |
| Comp. Ex. 1 | 2590 | 60.3 | 199 | 286 |
| Comp. Ex. 2 | 2830 | 62.0 | 223 | 275 |
| Ex. 4 | 4050 | 71.0 | 311 | 218 |
| Comp. Ex. 3 | 3030 | 61.8 | 229 | 247 |
| Ex. 5 | 3830 | 69.0 | 297 | 227 |
| Ex. 6 | 3690 | 71.0 | 300 | 219 |
| Ex. 7 | 3290 | 67.2 | 265 | 232 |

What is claimed is:

1. A piezoelectric ceramic comprising a perovskite-based solid solution represented by the formula:

$$Pb_{1-a}M_a\{(Ni_{1-b}Zn_b)_{1/3}Nb_{2/3}\}_xTi_yZr_zO_3$$

wherein M represents Ba or Sr, x+y+z=1, and a=0.01 to 0.10 b=0.50 to 0.90 x=0.15 to 0.25 y=0.35 to 0.45 and z=0.35 to 0.45, wherein said perovskite-based solid solution comprises at least one metallic ion oxide selected from Group A in combination with at least one metallic ion oxide selected from Group B:

Group A: $La_2O_3$ and $Nd_2O_3$, and

Group B: NiO, $Fe_2O_3$, $SnO_2$ and $Ta_2O_5$.

2. The piezoelectric ceramic as claimed in claim 1, wherein the metallic ion of said at least one metallic ion oxide selected from Group A is present in an amount of 0.5 to 2.0 equivalents, when the total equivalents of Pb and M of the perovskite-based solid solution is 100, and the metallic ion of said at least one metallic ion oxide selected from Group B is present in an amount satisfying the relationship $1.0 \leq N \leq 4.0$ wherein

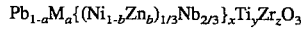

wherein $n_{Ai}$ represents the valence of the metallic ion of the at least one metallic ion oxide selected from Group A, $n_{Bj}$ represents the valence of the metallic ion of the at least one metallic ion oxide selected from Group B, $\chi_{Ai}$ represents the equivalent of the metallic ion of the at least one metallic oxide selected from Group A, and $\chi_{Bj}$ represents the equivalent of the metallic ion of the at least one metallic ion oxide selected from Group B.

3. The piezoelectric ceramic as claimed in claim 1, wherein x=0.17 to 0.23.

4. The piezoelectric ceramic as claimed in claim 1, wherein y=0.37 to 0.43.

5. The piezoelectric ceramic as claimed in claim 1, wherein z=0.37 to 0.43.

6. The piezoelectric ceramic as claimed in claim 1, wherein x=0.17 to 0.23, y=0.37 to 0.43, and z=0.37 to 0.43.

* * * * *

UNITED STATES PATENT AND TRADEMARK OFFICE
CERTIFICATE OF CORRECTION

PATENT NO. : 5,500,142
DATED : March 19, 1996
INVENTOR(S) : Yoshihisa USHIDA et al.

It is certified that error appears in the above-indentified patent and that said Letters Patent is hereby corrected as shown below:

In Column 5, Table 1, Ex. 1, change "$N^{2+}$" to --$Ni^{2+}$--

In Column 6, Table 1, Comp. Ex. 2, change "$N^{2+}$" to --$Ni^{2+}$--

In Column 6, Table 1, Ex. 4, change "$N^{2+}$" to --$Ni^{2+}$--

In Column 6, Table 1, Ex. 5, change "$N^{2+}$" to --$Ni^{2+}$--

Signed and Sealed this

Seventh Day of January, 1997

Attest:

BRUCE LEHMAN

*Attesting Officer*  *Commissioner of Patents and Trademarks*